(12) United States Patent
Grove et al.

(10) Patent No.: US 11,984,335 B2
(45) Date of Patent: May 14, 2024

(54) FOUP OR CASSETTE STORAGE FOR HYBRID SUBSTRATE BONDING SYSTEM

(71) Applicant: Applied Materials, Inc., Santa Clara, CA (US)

(72) Inventors: Coby Scott Grove, Whitefish, MT (US); Ruiping Wang, San Jose, CA (US); Avinash Shantaram, Whitefish, MT (US); Jitendra Ratilal Bhimjiyani, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 183 days.

(21) Appl. No.: 17/564,511

(22) Filed: Dec. 29, 2021

(65) Prior Publication Data
US 2023/0207358 A1 Jun. 29, 2023

(51) Int. Cl.
*H01L 21/673* (2006.01)
*H01L 21/677* (2006.01)

(52) U.S. Cl.
CPC .. *H01L 21/67303* (2013.01); *H01L 21/67778* (2013.01)

(58) Field of Classification Search
CPC ........... H01L 21/6773; H01L 21/67733; H01L 21/67303; H01L 21/67766; H01L 21/67778; H01L 21/67775; H01L 21/67769; H01L 21/67736; H01L 21/67167; H01L 21/67184; H01L 21/67196; H01L 21/67236; H01L 21/67294; H01L 21/67242; H01L 21/67745; H01L 21/67742; H01L 21/67363; H01L 21/67359; H01L 21/67721
See application file for complete search history.

(56) References Cited

U.S. PATENT DOCUMENTS

| | | | |
|---|---|---|---|
| 5,964,561 | A | 10/1999 | Marohl |
| 6,579,052 | B1 | 6/2003 | Bonora et al. |
| 8,894,344 | B2 | 11/2014 | Merry et al. |
| 9,299,597 | B2 | 3/2016 | Rebstock |

(Continued)

OTHER PUBLICATIONS

International Search Report for PCT/US2022/054078, dated May 4, 2023.

*Primary Examiner* — Glenn F Myers
(74) *Attorney, Agent, or Firm* — MOSER TABOA

(57) ABSTRACT

Embodiments of equipment front end modules (EFEMs) are provided herein. In some embodiments, an EFEM includes: two or more loadports for receiving two or more types of substrates; an overhead storage unit having a plurality of storage shelves disposed above the two or more loadports and configured to hold two or more types of front opening unified pods (FOUPs) of different sizes that store the two or more types of substrates, respectively, wherein a horizontal alley is disposed between the plurality of storage shelves and the two or more loadports to provide a horizontal passageway for the FOUPs during transport to the two or more loadports; and an overhead transport system having a pair of vertical actuators disposed on opposite sides of the overhead storage unit and configured to transport FOUPs from the overhead storage unit to the two or more loadports.

19 Claims, 5 Drawing Sheets

(56) References Cited

U.S. PATENT DOCUMENTS

| | | | |
|---|---|---|---|
| 2002/0187024 A1* | 12/2002 | Nulman | H01L 21/67769 |
| | | | 414/217 |
| 2007/0093071 A1* | 4/2007 | Verhaverbeke | H01L 21/67173 |
| | | | 430/269 |
| 2008/0138176 A1* | 6/2008 | Kim | H01L 21/67196 |
| | | | 414/217 |
| 2010/0278622 A1 | 11/2010 | Huang et al. | |
| 2015/0303094 A1* | 10/2015 | Kim | H01L 21/67161 |
| | | | 156/345.32 |
| 2017/0133255 A1 | 5/2017 | Aguilar et al. | |
| 2018/0096873 A1 | 4/2018 | Bonora et al. | |
| 2018/0158708 A1 | 6/2018 | Kuo | |
| 2018/0244470 A1* | 8/2018 | Murata | B65G 1/14 |
| 2019/0244845 A1* | 8/2019 | Parathithasan | H01L 21/67383 |
| 2020/0105562 A1* | 4/2020 | Yoon | H01L 21/67253 |
| 2020/0105561 A1 | 10/2020 | Yoon et al. | |
| 2021/0118714 A1* | 4/2021 | Raga-Barone | G03F 7/70741 |
| 2021/0134636 A1* | 5/2021 | Teramoto | H01L 21/67775 |
| 2021/0166953 A1* | 6/2021 | Hsiung | H01L 23/367 |
| 2022/0197128 A1* | 6/2022 | Gautam | H01L 21/67207 |

\* cited by examiner

FOUP OR CASSETTE STORAGE FOR HYBRID SUBSTRATE BONDING SYSTEM

FIELD

Embodiments of the present disclosure generally relate to a substrate processing equipment.

BACKGROUND

Substrates undergo various processes during the fabrication of semiconductor integrated circuit devices. Some of these processes include wafer dicing, in which a processed wafer is placed on a dicing tape and is cut or separated into a plurality of die or chiplets. Once the wafer has been diced, the chiplets typically stay on the dicing tape until they are extracted and bonded to a substrate. Convention processing tools for cleaning, dicing, and bonding chiplets to a substrate generally include multiple tools or a single linear robot housed in a mainframe tool. However, such convention processing tools provide limited storage and automated processing of different types of substrates.

Accordingly, the inventors have provided improved multi-chamber processing tools with enhanced substrate storage systems.

SUMMARY

Embodiments of equipment front end modules (EFEMs) are provided herein. In some embodiments, an EFEM includes: two or more loadports for receiving two or more types of substrates; an overhead storage unit having a plurality of storage shelves disposed above the two or more loadports and configured to hold two or more types of front opening unified pods (FOUPs) of different sizes that store the two or more types of substrates, respectively, wherein a horizontal alley is disposed between the plurality of storage shelves and the two or more loadports to provide a horizontal passageway for the FOUPs during transport to the two or more loadports; and an overhead transport system having a pair of vertical actuators disposed on opposite sides of the overhead storage unit and configured to transport FOUPs from the overhead storage unit to the two or more loadports.

In some embodiments, an EFEM, includes: two or more loadports for receiving two or more types of substrates; an overhead storage unit having a plurality of storage shelves disposed above the two or more loadports and configured to hold front opening unified pods (FOUPs) that store the two or more types of substrates; and an overhead transport system configured to transport FOUPs from the overhead storage unit to the two or more loadports, wherein the overhead transport system includes a pair of vertical actuators configured to transport the FOUPs vertically, one or more horizontal actuators configured to transport the FOUPs horizontally, and a gripper coupled to the one or more horizontal actuators to transport the FOUPs.

In some embodiments, a multi-chamber processing tool for processing substrates includes: an equipment front end module (EFEM), comprising: two or more loadports for receiving two or more types of substrates; an overhead storage unit having a plurality of storage shelves disposed above the two or more loadports and configured to hold front opening unified pods (FOUPs) that store the two or more types of substrates; and an overhead transport system configured to transport FOUPs from the overhead storage unit to the two or more loadports; and a plurality of automation modules coupled to each other and having a first automation module coupled to the EFEM, wherein each of the plurality of automation modules include a transfer chamber and one or more process chambers coupled to the transfer chamber, wherein the transfer chamber includes a buffer configured to hold a plurality of the two or more types of substrates.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
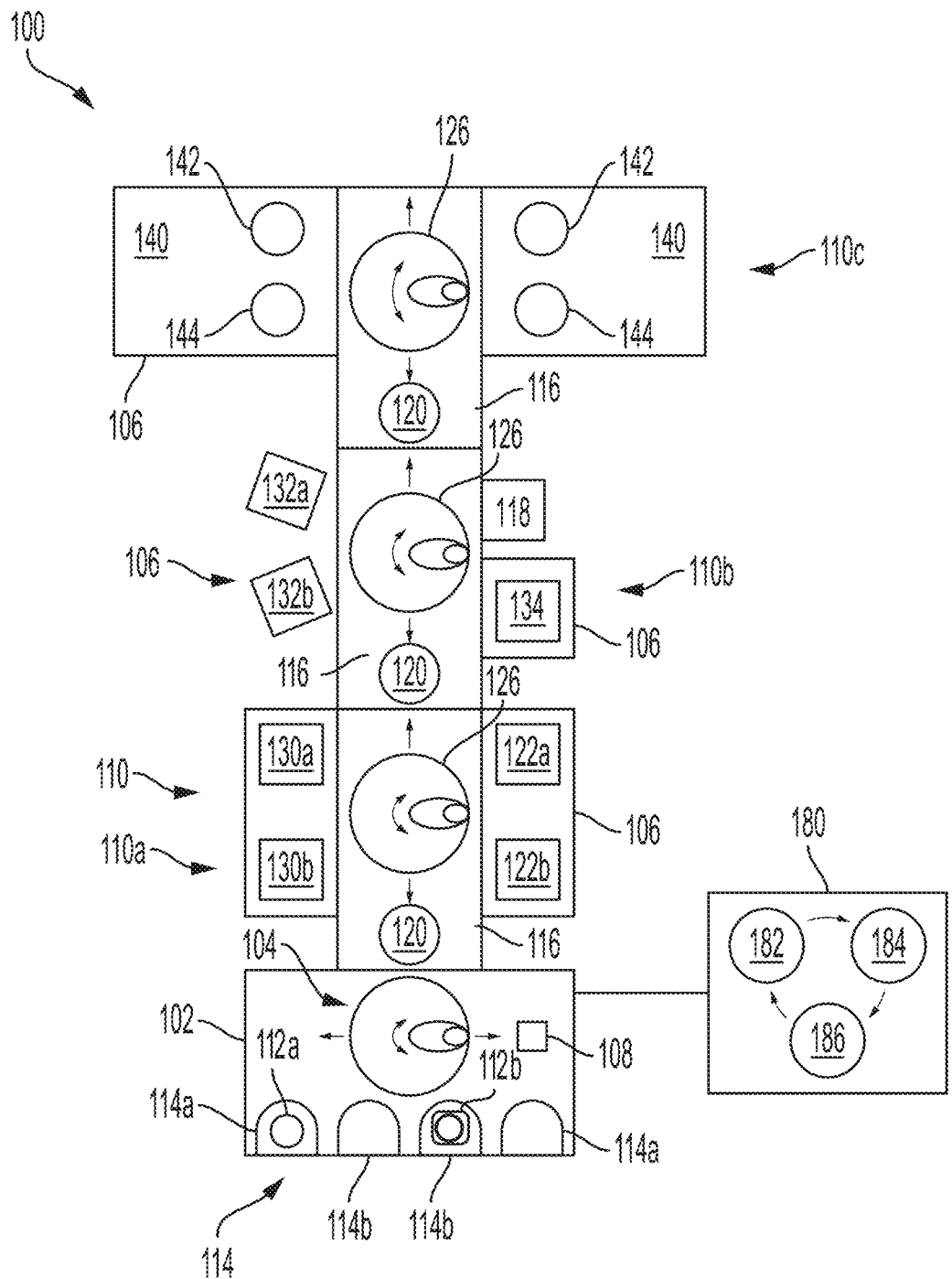
FIG. 1 depicts a schematic top view of a multi-chamber processing tool for bonding chiplets to a substrate in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing substrates are provided herein. The apparatus generally comprises a multi-chamber processing tool that is modular and includes one or more equipment front end modules (EFEM) for loading substrates into and out of the multi-chamber processing tool that are coupled to a plurality of automation modules configured to perform one or more processing steps on the substrates. The one or more EFEMs generally include an overhead storage unit having a plurality of storage shelves for supporting front opening unified pods (FOUPs) having a plurality of different substrate types. The FOUPs may support substrates directly onto a plurality of holders or may support cassettes configured to hold one or more substrates therein. The plurality of automation modules generally can interface with the EFEM to hand off substrates from the plurality of different substrate types to one or more process chambers associated with each of the automation modules. The overhead storage unit provides improved throughput of substrates in the multi-chamber processing tool.

The one or more processing steps may be any suitable step in manufacturing or packaging integrated circuits. For example, the one or more processing steps may be configured to perform one or more of the following: a bonding process to bond a plurality of chiplets onto the substrates, a plasma dicing or singulation process, a substrate cleaning process, a substrate plating or coating process, or the like. The plurality of storage shelves may advantageously facilitate storing different types of substrates within the multi-chamber processing tool (in-situ), increasing substrate processing throughput.

Each of the plurality of automation modules include a transfer robot, allowing the transfer robots to work in parallel to advantageously increase processing throughput by facilitating processing of multiple substrates at the same time. For the example process of bonding the plurality of chiplets onto the substrates, the multi-chamber processing tool advantageously allows for storing a plurality of different substrate types (e.g., wafers, tape frames with different sized chiplets) and bonding the plurality of chiplets having different sizes onto the wafers in an all-in-one multi-chamber processing tool. The plurality of chiplets may be bonded in multiple layers on the wafer within the multi-chamber processing tool.

FIG. 1 depicts a schematic top view of a multi-chamber processing tool 100 for bonding chiplets to a substrate in accordance with at least some embodiments of the present disclosure. The multi-chamber process tool 100 generally includes an equipment front end module (EFEM) 102 and a plurality of automation modules 110 that are serially coupled to the EFEM 102. The plurality of automation modules 110 are configured to shuttle one or more types of substrates 112 from the EFEM 102 through the multi-chamber process tool 100 and perform one or more processing steps to the one or more types of substrates 112. Each of the plurality of automation modules 110 generally include a transfer chamber 116 and one or more process chambers 106 coupled to the transfer chamber 116 to perform the one or more processing steps. The plurality of automation modules 110 are coupled to each other via their respective transfer chamber 116 to advantageously provide modular expandability and customization of the multi-chamber process tool 100. As depicted in FIG. 1, the plurality of automation modules 110 comprise three automation modules, where a first automation module 110a is coupled to the EFEM 102, a second automation module 110b is coupled to the first automation module 110a, and a third automation module 110c is coupled to the second automation module 110b.

The EFEM 102 includes a plurality of loadports 114 for receiving one or more types of substrates 112. In some embodiments, the one or more types of substrates 112 include 200 mm wafers, 300 mm wafers, 450 mm wafers, tape frame substrates, carrier substrates, silicon substrates, glass substrates, or the like. In some embodiments, the plurality of loadports 114 include at least one of one or more first loadports 114a for receiving a first type of substrate 112a or one or more second loadports 114b for receiving a second type of substrate 112b. In some embodiments, the first type of substrates 112a have a different size than the second type of substrates 112b. In some embodiments, the second type of substrates 112b include tape frame substrates or carrier substrates. In some embodiments, the second type of substrates 112b include a plurality of chiplets disposed on a tape frame or carrier plate. In some embodiments, the second type of substrates 112b may hold different types and sizes of chiplets. As such, the one or more second loadports 114b may have different sizes or receiving surfaces configured to load the second type of substrates 112b having different sizes.

In some embodiments, the plurality of loadports 114 are arranged along a common side of the EFEM 102. Although FIG. 1 depicts a pair of the first loadports 114a and a pair of the second loadports 114b, the EFEM 102 may include other combinations of loadports such as one first loadport 114a and three second loadports 114b.

In some embodiments, the EFEM 102 includes a scanning station 108 having substrate ID readers for scanning the one or more types of substrates 112 for identifying information. In some embodiments, the substrate ID readers include a bar code reader or an optical character recognition (OCR) reader. The multi-chamber processing tool 100 is configured to use any identifying information from the one or more types of substrates 112 that are scanned to determine process steps based on the identifying information, for example, different process steps for the first type of substrates 112a and the second type of substrates 112b. In some embodiments, the scanning station 108 may also be configured for rotational movement to align the first type of substrates 112a or the second type of substrates 112b. In some embodiments, the one or more of the plurality of automation modules 110 include a scanning station 108.

An EFEM robot 104 is disposed in the EFEM 102 and configured to transport the first type of substrates 112a and the second type of substrates 112b between the plurality of loadports 114 to the scanning station 108. The EFEM robot 104 may include substrate end effectors for handling the first type of substrates 112a and second end effectors for handling the second type of substrates 112b. The EFEM robot 104 may rotate or rotate and move linearly.

Figure 2:
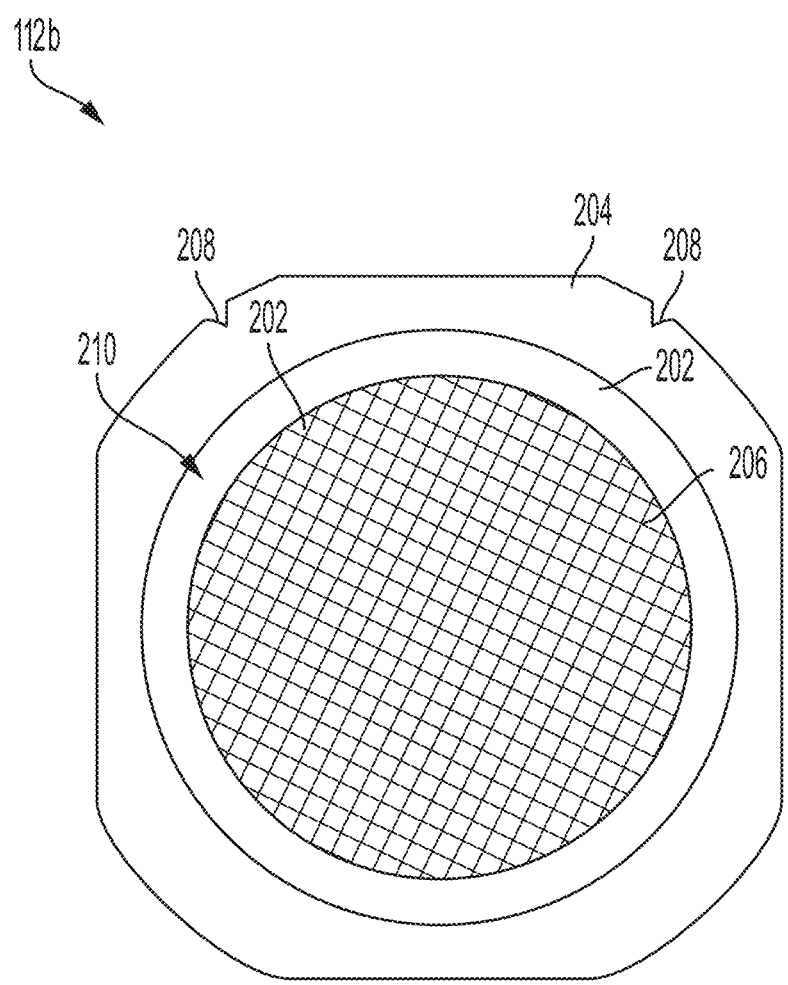
FIG. 2 depicts a second type of substrate in accordance with at least some embodiments of the present disclosure.

FIG. 2 depicts a second type of substrate 112b in accordance with at least some embodiments of the present disclosure. In some embodiments, the second type of substrate 112b is a tape frame substrate that generally comprises a layer of backing tape 202 surrounded by a tape frame 204. In use, a plurality of chiplets 206 can be attached to the backing tape 202. The plurality of chiplets 206 are generally formed via a singulation process that dices a semiconductor wafer 210 into the plurality of chiplets 206 or dies. In some embodiments, the tape frame 204 is made of metal, such as stainless steel. The tape frame 204 may have one or more notches 208 to facilitate alignment and handling. For a semiconductor wafer 210 having a 300 mm diameter, the tape frame 204 may have a width of about 340 mm to about 420 mm and a length of about 340 mm to about 420 mm. The second type of substrate 112b may alternatively be a carrier plate configured to have the plurality of chiplets 206 coupled to the carrier plate.

Referring back to FIG. 1, the one or more process chambers 106 may be sealingly engaged with the transfer chamber 116. The transfer chamber 116 generally operates at atmospheric pressure but may be configured to operate at vacuum pressure. For example, the transfer chamber 116 may be a non-vacuum chamber configured to operate at an atmospheric pressure of about 700 Torr or greater. Additionally, while the one or more process chambers 106 are generally depicted as orthogonal to the transfer chamber 116, the one or more process chambers 106 may be disposed at an angle with respect to the transfer chamber 116 or a combination of orthogonal and at an angle. For example, the second automation module 110b depicts a pair of the one or more process chambers 106 disposed at an angle with respect to the transfer chamber 116.

The transfer chamber 116 includes a buffer 120 configured to hold one or more first type of substrates 112a. In some embodiments, the buffer 120 is configured to hold one or more of the first type of substrates 112a and one or more of the second type of substrates 112b. The transfer chamber 116 includes a transfer robot 126 configured to transfer the first type of substrates 112a and the second type of substrates 112b between the buffer 120, the one or more process chambers 106, and a buffer disposed in an adjacent automation module of the plurality of automation modules 110. For example, the transfer robot 126 in the first automation module 110a is configured to transfer the first type of substrates 112a and the second type of substrates 112b between the first automation module 110a and the buffer 120 in the second automation module 110b. In some embodiments, the buffer 120 is disposed within the interior volume of the transfer chamber 116, advantageously reducing the footprint of the overall tool. In addition, the buffer 120 can be open to the interior volume of the transfer chamber 116 for ease of access by the transfer robot 126.

Figure 3:
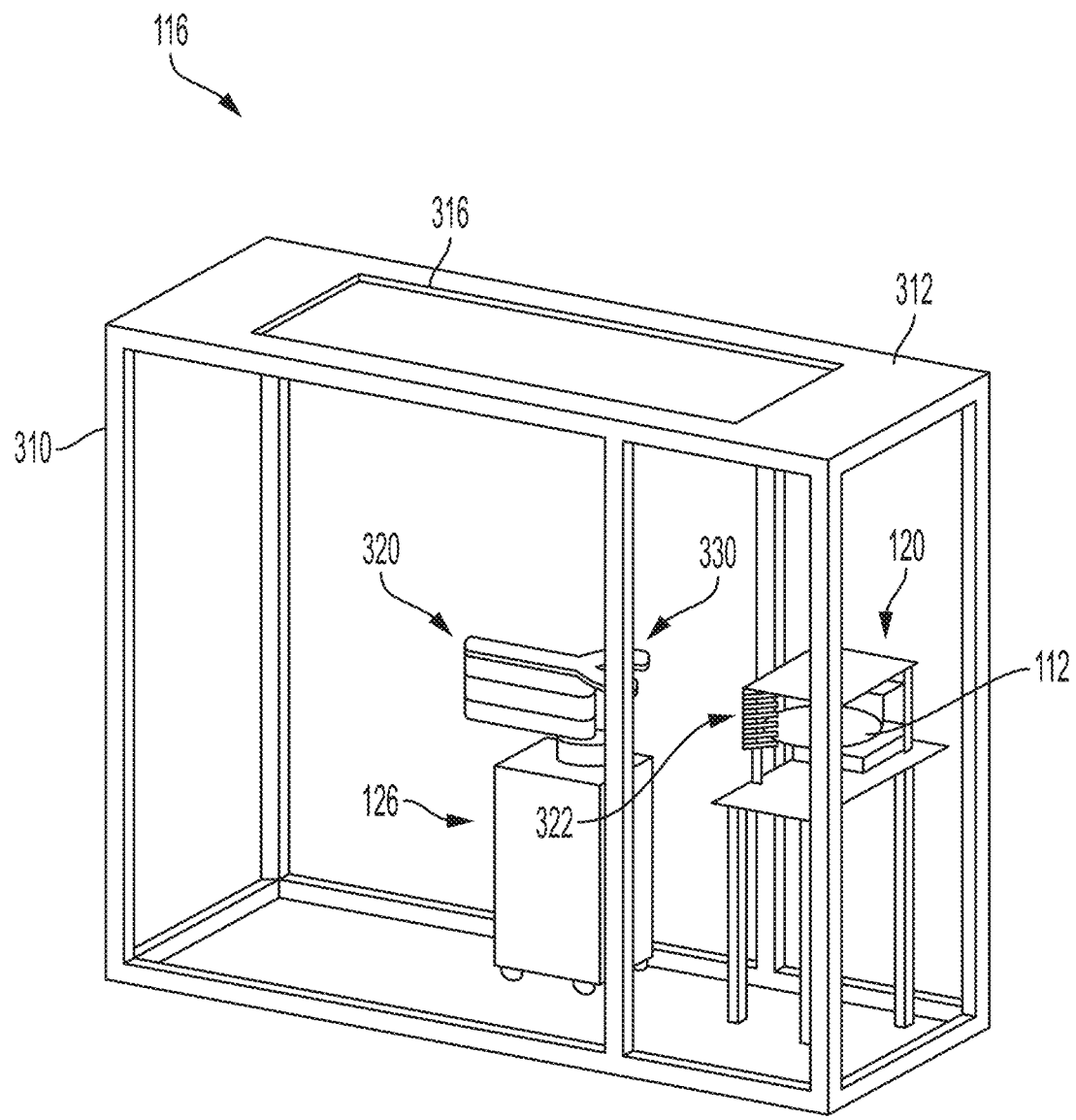
FIG. 3 depicts an isometric view of a transfer chamber of the plurality of automation modules in accordance with at least some embodiments of the present disclosure.

FIG. 3 depicts an isometric view of a transfer chamber 116 of the plurality of automation modules 110 in accordance with at least some embodiments of the present disclosure. The transfer chamber 116 is depicted in simplified form to describe the key components. The transfer chamber 116 generally includes a frame 310 that is covered with plates (top plate 312 shown in FIG. 3, side plates not shown) to enclose the transfer chamber 116. In some embodiments, the transfer chamber 116 has a width less than a length. The top plate 312 (or side plates) may include an access opening 316 that is selectively opened or closed for servicing the transfer chamber 116. The side plates include openings at interfaces with at least one of the one or more process chambers 106, the EFEM 102, or adjacent transfer chambers. While FIG. 3 shows the transfer chamber 116 having a rectangular or box shape, the transfer chamber 116 may have any other suitable shape, such as cylindrical, hexagonal, or the like. The one or more process chamber 106 may be coupled orthogonally to the transfer chamber 116 or may be coupled at an angle with respect to the transfer chamber 116.

The transfer chamber 116 may have one or more environmental controls. For example, an airflow opening (e.g., access opening 316) in the transfer chamber 116 may include a filter to filter the airflow entering the transfer chamber 116. Other environmental controls may include one or more of humidity control, static control, temperature control, or pressure control.

The transfer robot 126 is generally housed within the frame 310. The transfer robot 126 is configured for rotational or rotational and linear movement within the transfer chamber 116. In some embodiments, the transfer robot 126 moves linearly via rails on a floor of the transfer chamber 116 or via wheels under the transfer robot 126. The transfer robot 126 includes a telescoping arm 320 having one or more end effectors 330 that can extend into the one or more process chamber 106 and into adjacent automation modules. In some embodiments, the one or more end effectors 330 comprise substrate end effectors for handling the first type of substrates 112a and second end effectors for handling the second type of substrates 112b. In some embodiments, for a transfer chamber 116 having a length of about 2.0 to about 2.5 meters, the telescoping arm 320 may have a stroke length of up to about 1.0 meter. In some embodiments, the EFEM robot 104 is the same type and configuration as the transfer robot 126 for enhanced commonality of parts.

The buffer 120 is housed within the frame 310, for example, in an interior volume of the frame 310. In some embodiments, the buffer 120 is configured to rotate to align the first type of substrates 112a and the second type of substrates 112b in a desired manner. In some embodiments, the buffer 120 is configured to hold the one or more types of substrates 112 in a vertical stack advantageously reducing the footprint of the transfer chamber 116. For example, in some embodiments, the buffer 120 includes a plurality of shelves 322 for storing or holding one or more first type of substrates 112a and one or more second type of substrates 112b. In some embodiments, the plurality of shelves 322 are disposed in a vertically spaced apart configuration. In some embodiments, the buffer 120 includes six shelves. In some embodiments, the plurality of shelves comprises two shelves to accommodate the second type of substrates 112b.

Referring back to FIG. 1, the one or more process chambers 106 may include atmospheric chambers that are configured to operate under atmospheric pressure and vacuum chambers that are configured to operate under vacuum pressure. Examples of the atmospheric chambers may generally include wet clean chambers, radiation chambers, heating chambers, metrology chambers, bonding chambers, or the like. Examples of vacuum chambers may include plasma chambers. The types of atmospheric chambers discussed above may also be configured to operate under vacuum, if needed. The one or more process chambers 106 may be any process chambers or modules needed to perform a bonding process, a dicing process, a cleaning process, a plating process, or the like.

In some embodiments, the one or more process chambers 106 of each of the plurality of automation modules 110 include at least one of a wet clean chamber 122, a plasma chamber 130, a degas chamber 132, a radiation chamber 134, or a bonder chamber 140 such that the multi-chamber processing tool 100 includes at least one wet clean chamber 122, at least one plasma chamber 130, at least one degas chamber 132, at least one radiation chamber 134, and at least one bonder chamber 140. The one or more process chambers 106 may be arranged in any suitable location of the multi-chamber processing tool 100.

The wet clean chamber 122 is configured to perform a wet clean process to clean the one or more types of substrates 112 via a fluid, such as water. The wet clean chamber 122 may include a first wet clean chamber 122a for cleaning the first type of substrates 112a or a second wet clean chamber 122b for cleaning the second type of substrates 112b. The degas chamber 132 is configured to perform a degas process to remove moisture from the substrates 112 via for example, a high temperature baking process. In some embodiments, the degas chamber 132 includes a first degas chamber 132a for the first type of substrates 112a and a second degas chamber 132b for the second type of substrates 112b.

The plasma chamber 130 may be configured to perform an etch process to remove unwanted material, for example organic materials and oxides, from the first type of substrates 112a or the second type of substrates 112b. In some embodiments, the plasma chamber 130 includes a first plasma chamber 130a for the first type of substrates 112a and a second plasma chamber 130b for the second type of substrates 112b. The plasma chamber 130 may also be configured to perform an etch process to dice the substrates 112 into chiplets. In some embodiments, the plasma chamber 130 may be configured to perform a deposition process, for example, a physical vapor deposition process, a chemical vapor deposition process, or the like, to coat the first type of substrates 112a or the second type of substrates 112b with a desired layer of material.

The radiation chamber 134 is configured to perform a radiation process on the second type of substrates 112b to reduce adhesion between the plurality of chiplets 206 and the backing tape 202. For example, the radiation chamber 134 may be an ultraviolet radiation chamber configured to direct ultraviolet radiation at the backing tape 202 or a heating chamber configured to heat the backing tape 202. The reduced adhesion between the plurality of chiplets 206 and the backing tape 202 facilitates easier removal of the plurality of chiplets 206 from the second type of substrates 112b.

The bonder chamber 140 is configured to transfer and bond at least a portion of the plurality of chiplets 206 to one of the first type of substrates 112a. The bonder chamber 140 generally includes a first support 142 to support one of the first type of substrates 112a and a second support 144 to support one of the second type of substrates 112b.

In some embodiments, the one or more process chambers 106 of the first automation module 110a includes at least one of a plasma chamber 130 or a degas chamber 132 and includes a wet clean chamber 122. In the illustrative example of FIG. 1, the first automation module 110a includes a first plasma chamber 130a and a second plasma chamber 130b on a first side of the first automation module 110a. In some embodiments, the first automation module 110a includes a first wet clean chamber 122a and a second wet clean chamber 122b on a second side of the first automation module 110a opposite the first side. In some embodiments, the second automation module includes a radiation chamber 134 and at least one of a plasma chamber 130 or a degas chamber 132.

In some embodiments, a last automation module of the plurality of automation module 110, for example the third automation module 110c of FIG. 1, includes one or more bonder chambers 140 (two shown in FIG. 1). In some embodiments, a first of the two bonder chambers is configured to remove and bond chiplets having a first size and a second of the two bonder chambers is configured to remove and bond chiplets having a second size. In some embodiments, any of the plurality of automation modules 110 include a metrology chamber 118 configured to take measurements of the one or more types of substrates 112. In FIG. 1, the metrology chamber 118 is shown as a part of the second automation module 110b coupled to the transfer chamber 116 of the second automation module 110b. However, the metrology chamber 118 may be coupled to any transfer chamber 116 or within the transfer chamber 116.

A controller 180 controls the operation of any of the multi-chamber processing tools described herein, including the multi-chamber processing tool 100. The controller 180 may use a direct control of the multi-chamber processing tool 100, or alternatively, by controlling the computers (or controllers) associated with the multi-chamber processing tool 100. In operation, the controller 180 enables data collection and feedback from the multi-chamber processing tool 100 to optimize performance of the multi-chamber processing tool 100. The controller 180 generally includes a central processing unit (CPU) 182, a memory 184, and a support circuit 186. The CPU 182 may be any form of a general-purpose computer processor that can be used in an industrial setting. The support circuit 186 is conventionally coupled to the CPU 182 and may comprise a cache, clock circuits, input/output subsystems, power supplies, and the like. Software routines, such as a method as described below may be stored in the memory 184 and, when executed by the CPU 182, transform the CPU 182 into a specific purpose computer (controller 180). The software routines may also be stored and/or executed by a second controller (not shown) that is located remotely from the multi-chamber processing tool 100.

The memory 184 is in the form of computer-readable storage media that contains instructions, when executed by the CPU 182, to facilitate the operation of the semiconductor processes and equipment. The instructions in the memory 184 are in the form of a program product such as a program that implements methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 4:
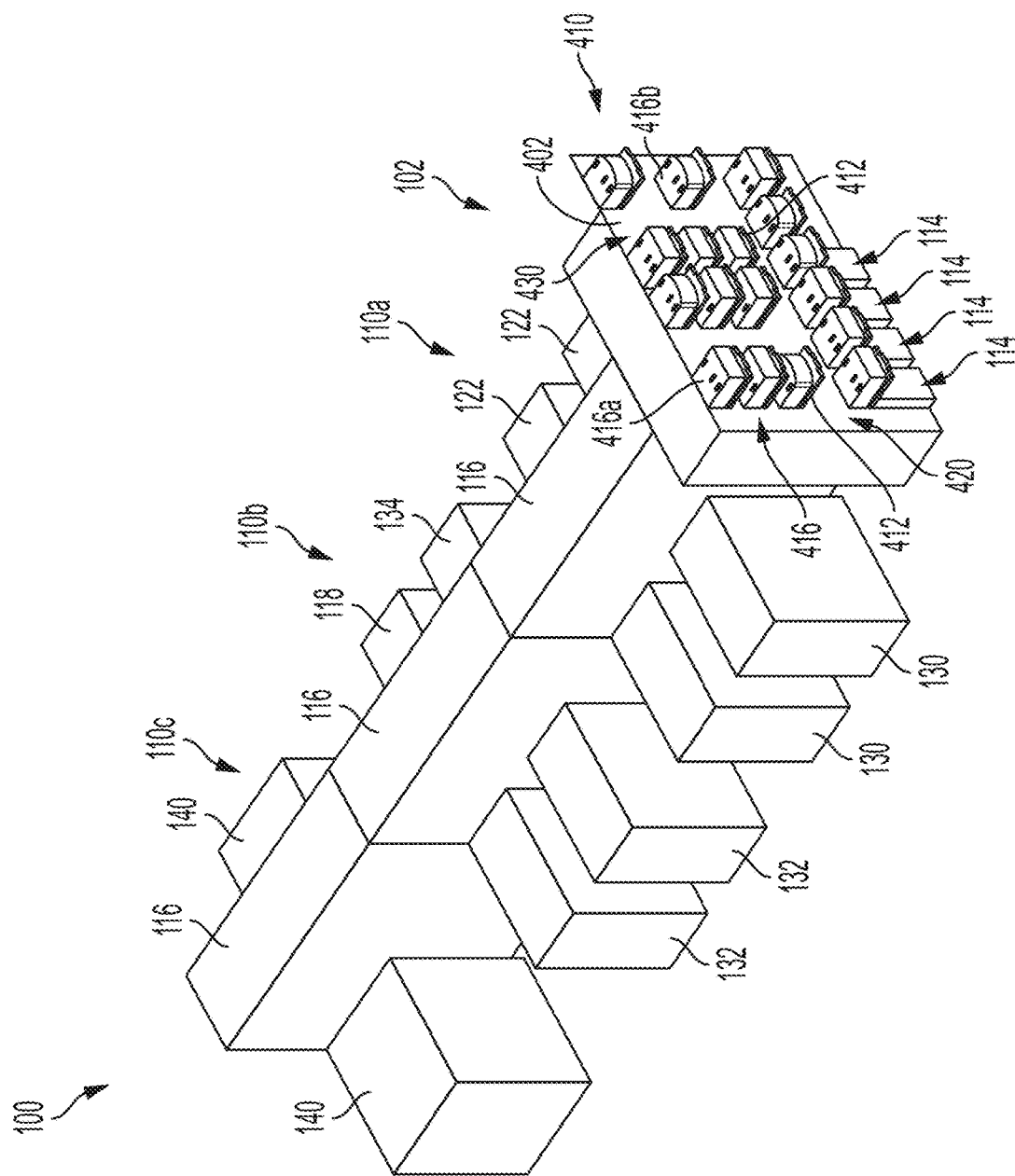
FIG. 4 depicts a schematic left isometric view of a multi-chamber processing tool having an equipment front end module (EFEM) with an overhead storage unit in accordance with at least some embodiments of the present disclosure.

FIG. 4 depicts a schematic left isometric view of a multi-chamber processing tool 100 having an equipment front end module (EFEM) 102 with an overhead storage unit 410 in accordance with at least some embodiments of the present disclosure. The overhead storage unit 410 generally includes a frame 402 and a plurality of storage shelves 412 coupled to the frame 402. In some embodiments, the plurality of storage shelves 412 are disposed above the one or more loadports 114. In some embodiments, the one or more loadports comprises exactly four loadports.

The plurality of storage shelves 412 are configured to hold front opening unified pods (FOUPs) 416 that store the one or more types of substrates 112. The plurality of storage shelves 412 may be configured to hold FOUPs 416 of different sizes. The FOUPs 416 may comprise one or more first FOUP 416a configured to store one or more of the first type of substrate 112a and one or more second FOUP 416b configured to store one or more of the second type of substrate 112b. In some embodiments, the one or more second FOUPs 416b are larger by size than the one or more first FOUPs 416a. For example, in some embodiments, the one or more second FOUPs 416b are taller than the one or more first FOUPs 216a. In some embodiments, the plurality of storage shelves 412 may all be a same size. In some embodiments, the plurality of storage shelves 412 may have a first size to accommodate the one or more first FOUPs 416a and a second size to accommodate the one or more second FOUPs 416b.

In some embodiments, the plurality of storage shelves 412 are arranged along a common plane in a plurality of columns and a plurality of rows. In some embodiments, the plurality of columns comprises more than two columns. In some embodiments, a horizontal alley 420 is disposed between the plurality of storage shelves 412 and the one or more loadports 114 to provide a horizontal passageway for the FOUPs 416 during transport to the one or more loadports 114. In some embodiments, the plurality of storage shelves 412 are arranged such that one or more vertical alleys 430 are disposed between the plurality of columns and configured to provide a vertical passageway for the FOUPs 416 during transport to the one or more loadports 114.

Figure 5:
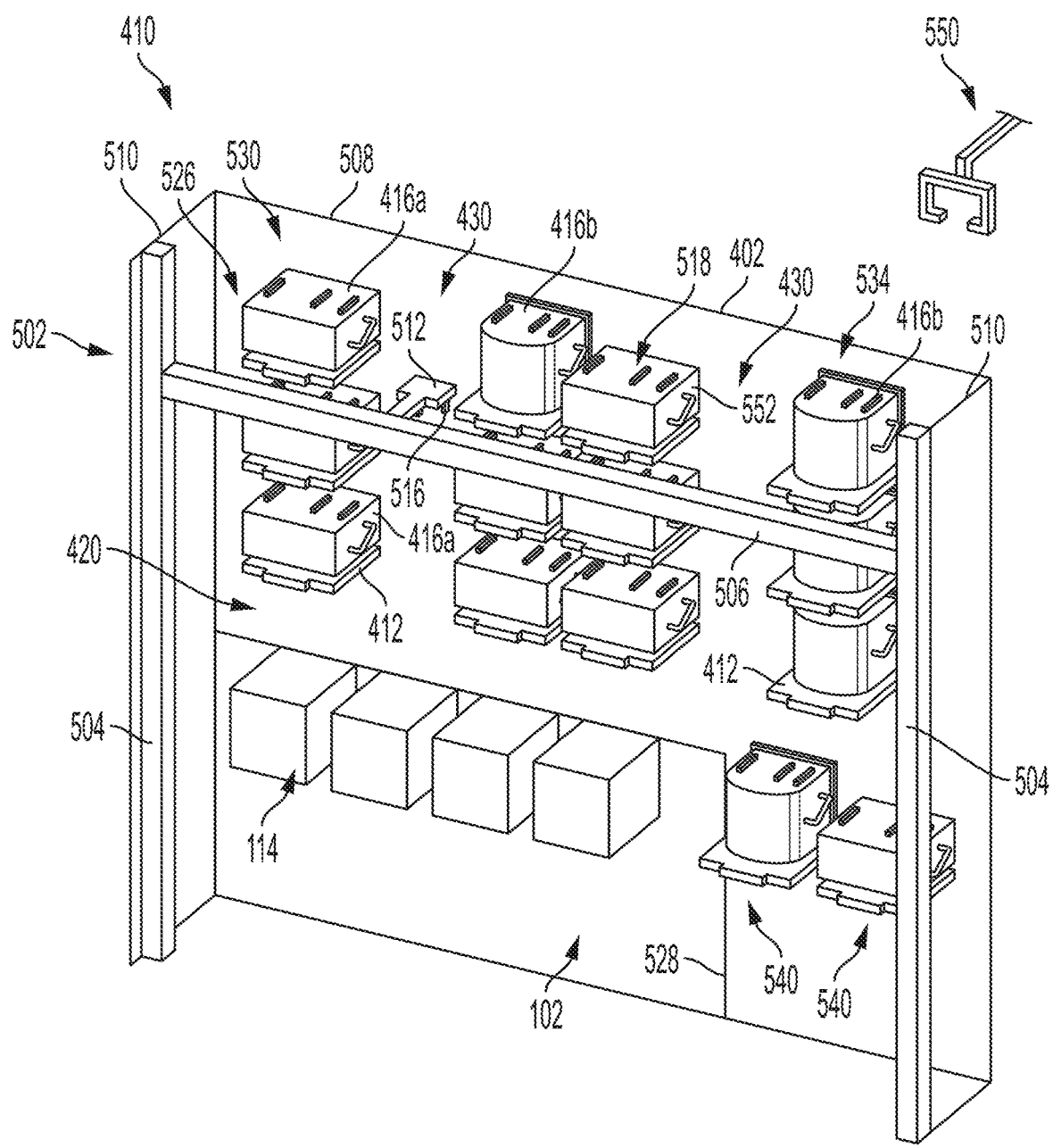
FIG. 5 depicts an isometric schematic view of a portion of an EFEM in accordance with at least some embodiments of the present disclosure.

FIG. 5 depicts an isometric schematic view of a portion of an EFEM 102 in accordance with at least some embodiments of the present disclosure. The EFEM 102 includes an overhead transport system 502 configured to transport FOUPs 416 from the overhead storage unit 410 to the one or more loadports 114. In some embodiments, the frame 402 includes a back wall 508 and sidewalls 510 extending from the back wall 508 to at least partially enclose the plurality of storage shelves 412.

In some embodiments, the overhead transport system 502 includes a pair of vertical actuators 504. The pair of vertical actuators 504 are generally configured to transport the FOUPs 416 vertically. In some embodiments, the pair of vertical actuators 504 are disposed on opposite sides of the overhead storage unit 410. In some embodiments, the pair of vertical actuators 504 are fixed horizontally with respect to each other. In some embodiments, the plurality of storage shelves 412 are disposed horizontally between the pair of vertical actuators 504. In some embodiments, the pair of vertical actuators 504 are coupled to the sidewalls 510 of the frame 402. In some embodiments, the frame 402 may include a cutout 528 to accommodate the one or more loadports 114.

In some embodiments, the overhead transport system 502 includes one or more horizontal actuators 506 (one shown in FIG. 5) coupled to the pair of vertical actuators 504 and configured to transport the FOUPs horizontally. In some embodiments, at least one of the one or more horizontal actuators 506 includes a gripper 512 configured to transport the FOUPs 416. In some embodiments, the pair of vertical actuators 504 are configured to move the gripper 512 vertically and the at least one of the one or more horizontal actuators 506 is configured to move the gripper 512 horizontally. The gripper 512 includes a clamp 516 configured to carry the FOUPs 416 for transport. In some embodiments, the FOUPs include a top handle 518 configured to engage with the clamp 516 to facilitate transport of the FOUPs. The top handle 518 may have any suitable shape for selectively engaging with the clamp 516. In some embodiments, the FOUPs 416 include one or more side handles 552 for transport with the clamp 516 or for manual transport by an operator.

In some embodiments, the overhead storage unit 410 includes one or more manual load stations 540. In some embodiments, the one or more manual load stations 540 are disposed below the horizontal alley 420. The overhead transport system 502 is configured to transports the FOUPs 416 from the one or more manual load stations 540 to the one or more loadports 114. In some embodiments, the one or more manual load stations 540 comprise two manual load stations.

In some embodiments, the frame 402 may form an enclosure (not shown) around the overhead storage unit 410. For example, the enclosure may include a front wall (not shown) having one or more doors for accessing the one or more loadports 114, the FOUPs 416, and the one or more manual load stations 540. In some embodiments, the frame 402 may be in the form of a cabinet.

In some embodiments, one of the plurality of storage shelves 412 is a loading station 530 for the FOUPs 416. In some embodiments, all of the FOUPs 416 are loaded onto the overhead storage unit 410 from the loading station 530. In some embodiments, the multi-chamber processing tool 100 includes a transfer robot 550 for transferring FOUPs 416 to the loading station 530. In some embodiments, another one of the plurality of storage shelves 412 is an unloading station 534 for the FOUPs 416. In some embodiments, the loading station 530 and the unloading station 534 are disposed along an uppermost row 526 of the plurality of storage shelves 412. The transfer robot 550 may be configured to unload FOUPs 416 from the unloading station 534, for example, once empty of the one or more types of substrates 112. Alternatively, a different transfer robot may be used to load and unload the FOUPs 416.

To facilitate ease of transport, in some embodiments, each of the plurality of storage shelves 412 is disposed adjacent one of the one or more vertical alleys 430. In some embodiments, the plurality of storage shelves 412 are arranged along four or more columns. In some embodiment, at least some of the plurality of storage shelves 412 are aligned with and disposed vertically above one or more of the one or more loadports 114.

While the foregoing is directed to embodiments of the present disclosure, other and further embodiments of the disclosure may be devised without departing from the basic scope thereof.

The invention claimed is:

1. An equipment front end module (EFEM), comprising:
    two or more loadports for receiving two or more types of substrates;
    an overhead storage unit having a plurality of storage shelves disposed above the two or more loadports and configured to hold two or more types of front opening unified pods (FOUPs) of different sizes that store the two or more types of substrates, respectively, wherein a horizontal alley is disposed between the plurality of storage shelves and the two or more loadports to provide a horizontal passageway for the FOUPs during transport to the two or more loadports;
    an overhead transport system having a pair of vertical actuators disposed on opposite sides of the overhead storage unit and configured to transport FOUPs from the overhead storage unit to the two or more loadports, wherein the plurality of storage shelves are disposed between the pair of vertical actuators;
    one or more first type of FOUPs disposed on respective ones of the plurality of storage shelves; and
    one or more second type of FOUPs configured to hold tape frame substrates disposed on respective ones of the plurality of storage shelves.

2. The EFEM of claim 1, wherein the overhead transport system includes one or more horizontal actuators coupled to the pair of vertical actuators and configured to transport the FOUPs horizontally.

3. The EFEM of claim 2, wherein at least one of the one or more horizontal actuators includes a gripper configured to transport the FOUPs, and wherein the pair of vertical actuators are configured to move the gripper vertically and the at least one of the one or more horizontal actuators is configured to move the gripper horizontally.

4. The EFEM of claim 1, wherein the EFEM is coupled to a bonding chamber.

5. The EFEM of claim 1, wherein the plurality of storage shelves are arranged along a common plane in a plurality of columns and a plurality of rows.

6. The EFEM of claim 5, further comprising one or more vertical alleys disposed between the plurality of columns configured to provide a vertical passageway for the FOUPs during transport to the two or more loadports.

7. The EFEM of claim 6, wherein each of the plurality of storage shelves is disposed adjacent one of the one or more vertical alleys.

8. The EFEM of claim 1, wherein the two or more loadports comprises at least one loadport configured to receive a semiconductor wafer.

9. The EFEM of claim 1, wherein one of the plurality of storage shelves is a loading station for the FOUPs and another one of the plurality of storage shelves is an unloading station for the FOUPs, and wherein the loading station and the unloading station are disposed along an uppermost row of the plurality of storage shelves.

10. An equipment front end module (EFEM), comprising:
two or more loadports for receiving two or more types of substrates;
an overhead storage unit having a plurality of storage shelves disposed above the two or more loadports and configured to hold two or more types of front opening unified pods (FOUPs) that store the two or more types of substrates;
an overhead transport system configured to transport FOUPs from the overhead storage unit to the two or more loadports, wherein the overhead transport system includes a pair of vertical actuators configured to transport the FOUPs vertically, one or more horizontal actuators configured to transport the FOUPs horizontally, and a gripper coupled to the one or more horizontal actuators to transport the FOUPs;
one or more first types of FOUPs disposed on respective ones of the plurality of storage shelves; and
one or more second types of FOUPs configured to hold tape frame substrates disposed on respective ones of the plurality of storage shelves.

11. The EFEM of claim 10, wherein the plurality of storage shelves are arranged along four or more columns.

12. The EFEM of claim 10, wherein the plurality of storage shelves are disposed horizontally between the pair of vertical actuators.

13. The EFEM of claim 10, wherein the two or more loadports comprises exactly four loadports.

14. The EFEM of claim 10, wherein the plurality of storage shelves are arranged in a plurality of columns such that one or more vertical alleys are disposed between at least some of the plurality of columns and configured to provide a vertical passageway for the FOUPs during transport to the two or more loadports.

15. A multi-chamber processing tool for processing substrates, comprising:
an equipment front end module (EFEM), comprising:
two or more loadports for receiving two or more types of substrates;
an overhead storage unit having a plurality of storage shelves disposed above the two or more loadports and configured to hold front opening unified pods (FOUPs) that store the two or more types of substrates; and
an overhead transport system configured to transport FOUPs from the overhead storage unit to the two or more loadports; and
a plurality of automation modules coupled to each other and having a first automation module coupled to the EFEM, wherein each of the plurality of automation modules include a transfer chamber and one or more process chambers coupled to the transfer chamber, wherein the transfer chamber includes a buffer configured to hold a plurality of the two or more types of substrates, wherein the one or more process chambers comprises one or more bonding chambers having a first support to support a first type of substrate of the two or more types of substrates and a second support to support a second type of substrate of the two or more types of substrates.

16. The multi-chamber processing tool of claim 15, wherein the transfer chamber includes a transfer robot configured to transfer the two or more types of substrates between the buffer, the one or more process chambers, and a buffer disposed in an adjacent automation module of the plurality of automation modules.

17. The multi-chamber processing tool of claim 15, wherein the EFEM includes one or more manual load stations, wherein the overhead transport system is configured to transport FOUPs from the one or more manual load stations to the two or more loadports.

18. The multi-chamber processing tool of claim 15, wherein the one or more process chambers include a wet clean chamber and a degas chamber.

19. The multi-chamber processing tool of claim 15, wherein the transfer chamber is a non-vacuum chamber.

* * * * *